(12) United States Patent
Sato

(10) Patent No.: US 6,608,347 B2
(45) Date of Patent: Aug. 19, 2003

(54) SEMICONDUCTOR DEVICE AND METHOD OF MANUFACTURING THE SAME

(75) Inventor: Kazuo Sato, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 66 days.

(21) Appl. No.: 09/791,774

(22) Filed: Feb. 26, 2001

(65) Prior Publication Data

US 2001/0040253 A1 Nov. 15, 2001

Related U.S. Application Data

(62) Division of application No. 09/105,213, filed on Jun. 26, 1998, now Pat. No. 6,232,179.

(30) Foreign Application Priority Data

Jun. 27, 1997 (JP) .............................................. 9-171394

(51) Int. Cl.⁷ ............................................. H01L 29/788
(52) U.S. Cl. ..................................... 257/316; 257/320
(58) Field of Search .................. 438/257–267; 215/315–322

(56) References Cited

U.S. PATENT DOCUMENTS

| | | | |
|---|---|---|---|
| 4,982,250 A | 1/1991 | Manos, II et al. | |
| 5,070,032 A | 12/1991 | Yuan et al. | |
| 5,631,179 A | 5/1997 | Sung et al. | |
| 5,661,053 A | * 8/1997 | Yuan | |
| 5,661,054 A | 8/1997 | Kauffman et al. | |
| 5,707,898 A | 1/1998 | Keller et al. | |
| 5,712,179 A | 1/1998 | Yuan | |
| 5,731,242 A | 3/1998 | Parat et al. | |
| 5,838,039 A | 11/1998 | Sato et al. | |
| 5,856,223 A | 1/1999 | Wang | |
| 5,877,980 A | 3/1999 | Mang et al. | |
| 5,915,176 A | 6/1999 | Lim | |
| 5,960,285 A | 9/1999 | Hong | |
| 5,972,752 A | 10/1999 | Hong | |
| 6,037,223 A | 3/2000 | Su et al. | |

FOREIGN PATENT DOCUMENTS

| | | |
|---|---|---|
| JP | 62125679 | 6/1987 |
| JP | 5-90598 A | 4/1993 |
| JP | 7-161848 A | 6/1995 |
| JP | 9-36257 A | 2/1997 |
| JP | 09045914 | 2/1997 |

* cited by examiner

Primary Examiner—Richard Booth
(74) Attorney, Agent, or Firm—McDermott, Will & Emery

(57) ABSTRACT

A gate insulating film composed of silicon oxide and a floating gate electrode composed of polysilicon are formed sequentially on a P-type silicon substrate. A capacitance insulating film composed of silicon oxide and a control gate electrode composed of polysilicon are formed on the floating gate electrode. First spacer films, each composed of silicon oxide and formed over the respective side faces of individual components, and second spacer films, each composed of silicon nitride and formed on the respective first spacer films, are also provided. Even when a high-temperature heat treatment is performed in an oxidizing atmosphere, oxygen is prevented from being supplied to both end portions of the capacitance insulating film and the control gate electrode, which suppresses an increase in thickness of the capacitance insulating film at both end portions thereof.

16 Claims, 9 Drawing Sheets

SEMICONDUCTOR DEVICE AND METHOD OF MANUFACTURING THE SAME

This application is a Divisional of application Ser. No. 09/105,213 filed Jun. 26, 1998 U.S. Pat. No. 6,232,179.

BACKGROUND OF THE INVENTION

The present invention relates to a semiconductor device including a capacitance portion composed of two conductive layers and a capacitance insulating film interposed therebetween, and also relates to a manufacturing method thereof.

Examples of conventionally known semiconductor devices including a capacitance portion, composed of two conductive layers and a capacitance insulating film interposed therebetween, in the semiconductor element thereof, include: a MOS transistor including a capacitance portion composed of a semiconductor substrate, a gate electrode and a gate insulating film; a dynamic RAM (Random Access Memory) including a memory capacitance portion composed of a storage node, a cell plate, and a capacitance insulating film; a floating-gate EEPROM (Electrically Erasable and Programmable Read Only Memory) including a memory capacitance portion composed of a floating gate, a control gate, and a capacitance insulating film; and a capacitance element provided in an analog circuit.

FIG. 11 is a cross-sectional view of a conventional floating-gate EEPROM. As shown in the drawing, a tunnel insulating film 110, a floating gate electrode 111, a capacitance insulating film 112, and a control gate electrode 113 are provided on a semiconductor substrate 101. In the semiconductor substrate 101, a source region 108 and a drain region 109 are formed, to be self-aligned with the floating gate electrode 111 and the overlying components identified above. The floating gate electrode 111, the capacitance insulating film 112, and the control gate electrode 113 constitute a capacitive coupling portion. The capacitive coupling portion has the function of causing the injection of electrons into the floating gate electrode 111 having its capacitance coupled with the capacitance of the control gate electrode 113 or the withdrawal of electrons therefrom by the application of a control voltage to the control electrode 113.

In a semiconductor device including such a capacitance portion having a capacitance insulating film, a single-layer silicon oxide film, a silicon nitride film with a high dielectric constant, or the like is used as the capacitance insulating film. The capacitance insulating film 112 shown in FIG. 11 is typically an insulating film containing silicon nitride such as a silicon-nitride/silicon-oxide two-layer film (ON film) and a silicon-oxide/silicon-nitride/siliconoxide three-layer film (ONO film). An oxynitride film has also been employed in a MOS transistor in particular.

On the other hand, the two conductive layers are normally two high-melting-point polysilicon films. For example, the floating gate electrode 111 and the control electrode 113 of the EEPROM shown in FIG. 11 are typically composed of polysilicon.

In recent years, as higher integration has been achieved in a semiconductor integrated circuit, further miniaturization and reduction of an operating voltage have been required for semiconductor devices including the above-mentioned capacitance portion. Lately, there has been an increasing demand for a semiconductor device with a capacitance portion having a typical size of 0.5 m (half-micron) or less. Consequently, each of the gate electrodes 111 and 112 shown in FIG. 11 tends to have a further reduced gate length.

However, if the lateral sizes of conductive layers overlying and underlying an electrostatic capacitance portion in a semiconductor device with a half-micron or smaller capacitance portion or the lateral sizes of the floating gate electrode and the control gate electrode in a floating-gate semiconductor memory device are adjusted at 0.5 $\mu$m or less, then the thickness of the capacitance insulating film 112 shown in FIG. 11 is likely to be nonuniform and have a larger thickness at both end portions thereof. The electrostatic capacitance between the floating gate electrode 111 and the control gate electrode 113 is reduced accordingly, which makes it difficult to provide a specified value of capacitance necessary to secure inherent properties. Such a nonuniform film thickness may be caused as follows.

Normally, the floating gate electrode 111, the capacitance insulating film 112 and the control gate electrode 113, which have been formed by patterning, are used as a mask, thereby implanting impurity ions into the semiconductor substrate 101 to form the source and drain regions 108 and 109. After the ion implantation, a heat treatment is performed in an oxidizing atmosphere at a high temperature of 800° C. to 1000° C. to activate the implanted impurity and thereby generate carriers. However, the heat treatment causes the phenomenon of the increased thickness at both ends of the capacitance insulating film 112. Specifically, when the capacitance insulating film 112 interposed between the control gate electrode 113 as the upper conductive layer and the floating gate electrode 111 as the lower conductive layer is oxidized rapidly from both side faces thereof in a half-micron or smaller capacitance portion, the capacitance insulating film 112 has remarkably different thicknesses at the central and peripheral portions thereof.

As a result of experiments, the present inventors found that oxidization is accelerated rapidly when each of the electrodes 111 and 113 is composed of polysilicon having a size of 0.4 $\mu$m or less in the lateral or channel longitudinal direction. This may be attributed to the phenomenon of accelerated oxidization of the polysilicon films interposing the capacitance insulating film.

Thus, as a voltage applied to the control gate electrode 113 has been further reduced, it has become more and more difficult to secure a required capacitive coupling ratio for conventional floating-gate semiconductor memory devices. As a result, numerous problems, like deterioration of device characteristics, have been caused. For example, write/erase speed and the amount of read current are adversely decreased. Moreover, other types of semiconductor devices are also highly likely to cause various deficiencies in the characteristics thereof because of the deterioration in capacitance value of the capacitance portion thereof.

SUMMARY OF THE INVENTION

The present invention was made in view of the above-described conventional problems. An object of the present invention is to provide a semiconductor device including a capacitance portion having a capacitance insulating film with a more uniform thickness by adopting measures to suppress an increase in thickness of the capacitance insulating film at both end portions thereof even when the capacitance portion has a half-micron or smaller lateral dimension.

A first semiconductor device according to the present invention includes: a semiconductor substrate; a first conductive film provided over the semiconductor substrate; a dielectric film, which is provided on the first conductive film and contains an oxidizing material; a second conductive film provided on the dielectric film; a first spacer film composed of an oxide film covering respective side faces of the first conductive film, the dielectric film, and the second conductive film; and a second spacer film covering the first spacer film and having a function of preventing oxygen from passing therethrough.

In such a structure, the second spacer film having a function of preventing oxygen from passing therethrough suppresses the supply of oxygen to both end portions of the dielectric film and to the first and second conductive films adjacent thereto, even when the semiconductor device is subjected to a heat treatment in an oxygen atmosphere. Consequently, an increase in thickness of the dielectric film at both ends thereof is prevented and a decrease in capacitance between the first and second conductive films is suppressed. Even when the second spacer film has a relatively insufficient insulating function, since the first spacer film composed of the oxide film having a sufficient insulating function is provided, it is possible to prevent leakage current from being generated between the first and second conductive films.

The first semiconductor device may be a nonvolatile semiconductor memory device including: a gate insulating film provided on the semiconductor substrate; a floating gate electrode provided on the gate insulating film; a capacitance insulating film provided on the floating gate electrode; and a control gate electrode provided on the capacitance insulating film. The first conductive film may be the floating gate electrode, the dielectric film may be the capacitance insulating film, and the second conductive film may be the control gate electrode.

As a result, a semiconductor device, operating with a low voltage and performing high-speed write and erase operations as a floating-gate semiconductor memory device with a high capacitive coupling ratio, is realized.

The first semiconductor device may further include a conductor protect film provided on the second conductive film and the first spacer film may extend to cover a side face of the conductor protect film.

If the conductor protect film is an oxide film in the first semiconductor device, the first spacer film preferably has an upper end lower in level than a top face of the conductor protect film.

Thus, it is possible to minimize the contact area between the conductor protect film and the first spacer film each composed of the oxide film. Consequently, the amount of oxygen supplied to the dielectric film via the conductor protect film and the first spacer film can be suppressed in the step of thermally treating the semiconductor device in an oxidizing atmosphere, which suppresses an increase in thickness of both end portions of the dielectric film.

In the first semiconductor device, if the conductor protect film is constituted by a first conductor protect film composed of an oxide film and a second conductor protect film, which is provided on the first conductor protect film and has a function of preventing oxygen from passing therethrough, the first spacer film preferably extends to cover respective side faces of the first and second conductor protect films.

In such a case, the oxide films are not exposed on the surface. Therefore, even if the first conductor protect film and the first spacer film, each composed of an oxide film, has a large contact area therebetween, the amount of oxygen supplied to the dielectric film via the conductor protect film and the first spacer film can be reduced with more certainty during the heat treatment process of the semiconductor device in an oxidizing atmosphere. As a result, it is possible to suppress an increase in thickness of the dielectric film at both end portions thereof.

In the first semiconductor device, the second spacer film may be a film containing silicon nitride.

In the first semiconductor device, the first and second spacer films may be provided to cover a top face and both side faces of a structure constituted by the first conductive film, the dielectric film, and the second conductive film.

In the first semiconductor device, the second spacer film may contain oxynitride.

A second semiconductor device according to the present invention includes: a semiconductor substrate; a gate insulating film provided on the semiconductor substrate; a floating gate electrode provided on the gate insulating film; a capacitance insulating film composed of a dielectric film provided on the floating gate electrode; a control gate electrode formed on the capacitance insulating film; a tunnel insulating film formed on a side face of the floating gate electrode or over a side face and a part of a top face of the floating gate electrode; an erasing gate electrode opposed to the floating gate electrode via the tunnel insulating film; and a spacer film provided over respective side faces of the control gate electrode and the capacitance insulating film and having a function of preventing oxygen from passing therethrough.

In such a structure, both end portions of the capacitance insulating film are covered with the spacer films during the heat treatment performed in an oxidizing atmosphere required to form the tunnel insulating film composed of the oxide film interposed between the erasing gate electrode and the floating gate electrode. Thus, it is possible to suppress an increase in thickness of the capacitance insulating film at both end portions thereof. As a result, a semiconductor device, operating with a low voltage and performing high-speed write and erase operations as a floating-gate semiconductor memory device with an erasing gate electrode having a high capacitive coupling ratio, can be obtained.

In the second semiconductor device, if the spacer film is composed of a first spacer film provided over the control gate electrode and the dielectric film and a second spacer film provided on the first spacer film, it is sufficient for at least one of the first and second spacer films to have a function of preventing oxygen from passing therethrough.

If the first spacer film is an oxide film in the second semiconductor device, it is sufficient for the second spacer film to have a function of preventing oxygen from passing therethrough.

If the second semiconductor device further includes a conductor protect film on the control gate electrode, the first spacer film preferably extends to cover a side face of the conductor protect film.

If the conductor protect film is an oxide film in the second semiconductor device, the first spacer film has preferably an upper end lower in level than a top face of the conductor protect film.

In the second semiconductor device, if the conductor protect film is constituted by a first conductor protect film composed of an oxide film and a second conductor protect film provided on the first conductor protect film and having a function of preventing oxygen from passing therethrough, the first spacer film preferably extends to cover respective side faces of the first and second conductor protect films.

In the second semiconductor device, the second spacer film may contain oxynitride.

In the second semiconductor device, the spacer film may be provided to cover a top face and a side face of a structure constituted by the control gate electrode and the capacitance insulating film.

A method of manufacturing a semiconductor device according to the present invention includes: a first step of forming a first conductive film over a semiconductor substrate; a second step of forming a dielectric film on the first conductive film; a third step of forming a second conductive film on the dielectric film; and a fourth step of forming a spacer film containing at least silicon nitride over at least respective side faces of the dielectric film and the second conductive film.

The method can suppress an increase in thickness of the dielectric film at both end portions thereof since the spacer film containing silicon nitride having a superior function of preventing oxygen from passing therethrough is formed in the fourth step.

The method of manufacturing a semiconductor device may further include the step of forming a gate insulating film on the semiconductor substrate prior to the first step. The first to third steps may include sequentially stacking a conductive film for a floating gate electrode, an insulating film for a capacitance insulating film, and a conductive film for a control gate electrode and patterning each of the films to form the floating gate electrode as the first conductive film, the capacitance insulating film as the dielectric film, and the control gate electrode as the second conductive film. The fourth step may include forming the spacer film over respective side faces of the control gate electrode, the capacitance insulating film, and the floating gate posterior to the third step.

In accordance with this method, the first semiconductor device can be formed.

Alternatively, the method of manufacturing a semiconductor device may further include the step of forming a gate insulating film on the semiconductor substrate prior to the first step. The first and second steps may include sequentially stacking a conductive film for a floating gate electrode, an insulating film for a capacitance insulating film, and a conductive film for a control gate electrode and patterning the conductive film for the control gate electrode and the insulating film for the capacitance insulating film to form the control gate electrode as the second conductive film and the capacitance insulating film as the dielectric film. The fourth step may include forming the spacer film over respective side faces of the control gate electrode and the capacitance insulating film. The third step may include patterning the conductive film for the floating gate electrode by using the control gate electrode and the capacitance insulating film as a mask to form the floating gate electrode as the first conductive film having an exposed side face posterior to the fourth step. The method may further include the steps of: thermally oxidizing the exposed side face of the floating gate electrode to form a tunnel insulating film composed of an oxide film posterior to the third step; and forming an erasing gate electrode opposed to the floating gate electrode via the tunnel insulating film.

In accordance with this method, the second semiconductor device can be formed.

In the method of manufacturing a semiconductor device, the fourth step may include forming a spacer film composed of a single-layer silicon nitride film.

In the method of manufacturing a semiconductor device, the fourth step may include forming a spacer film including a multilayer film composed of a silicon nitride film and an oxide film.

In the method of manufacturing a semiconductor device, the fourth step may include forming the spacer film including an oxynitride film.

DETAILED DESCRIPTION OF THE INVENTION

Embodiment 1

First, a floating-gate nonvolatile semiconductor memory device in a first embodiment of the present invention will be described.

Figure 1:
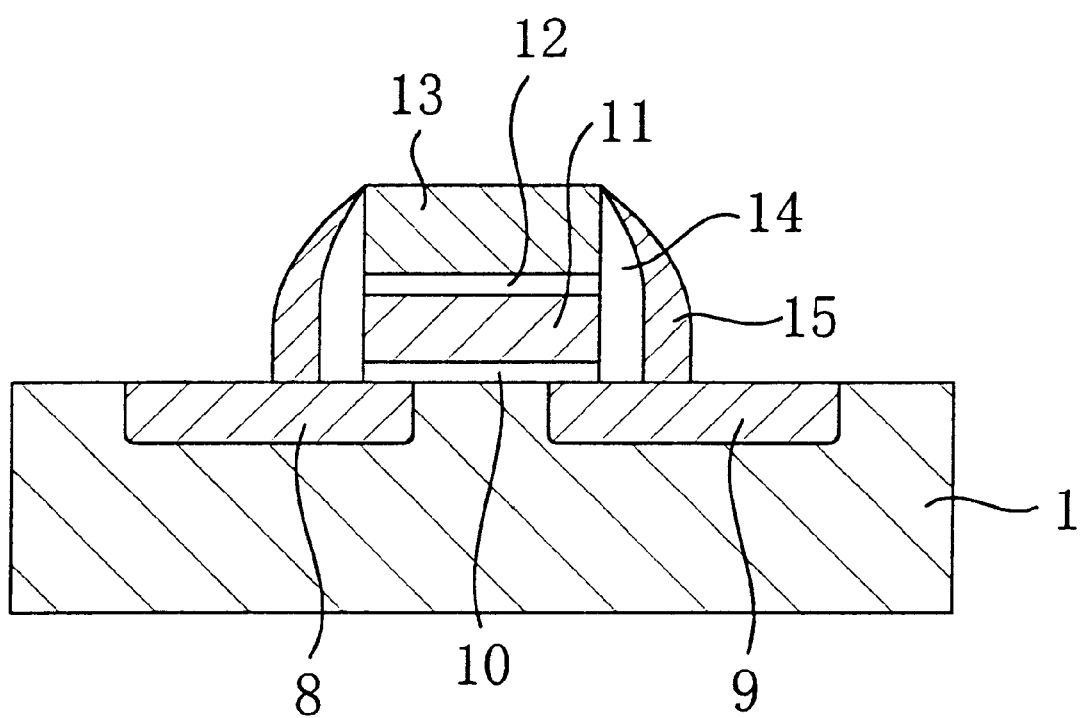
FIG. 1 is a cross-sectional view of a semiconductor device serving as a floating-gate semiconductor memory device in the first embodiment.

As shown in FIG. 1, a gate insulating film 10 composed of silicon oxide with a thickness of about 30 nm and a floating gate electrode 11 composed of polysilicon with a thickness of about 300 nm are formed sequentially on a P-type silicon substrate 1 in the semiconductor memory device of this embodiment. It is noted that the gate insulating film 10 may also be a silicon oxide film with a thickness of about 10 nm to serve as a tunnel insulating film. A capacitance insulating film 12 composed of silicon oxide with a thickness of about 25 nm and a control gate electrode 13 composed of polysilicon with a thickness of about 400 nm are formed on the floating gate electrode 11. In the silicon substrate 1, a source region 8 and a drain region 9 are formed by introducing an N-type impurity at a high concentration into the silicon substrate 1.

The semiconductor memory device according to the present invention is characterized in that it includes first spacer films 14, each composed of silicon oxide with a maximum thickness of about 200 nm (lateral dimension at the lower end thereof) which has been formed over the respective side faces of the floating gate electrode 11, the capacitance insulating film 12, and the control gate electrode 13 and second spacer films 15 each composed of silicon nitride with a maximum thickness of about 100 nm (lateral dimension at the lower end thereof) which has been formed on the side face of each of the first spacers 14. It is noted that an interlayer insulating film, an overlying metal layer, and the like are provided on the substrate, though the illustration thereof is omitted in FIG. 1.

In the semiconductor memory device of this embodiment, the second spacer films 15, each composed of antioxidant silicon nitride, are provided on the first spacer films 14, each composed of silicon oxide, which have been formed on the side faces of the capacitance insulating film 12 including the silicon oxide film. As a result, it is possible to prevent oxygen from being supplied to the respective end portions of the capacitance insulating film 12 and the control gate electrode 13 even when a high-temperature heat treatment is performed in an oxidizing atmosphere to activate the implanted impurity ions during the fabrication process of the semiconductor memory device. This makes it possible to suppress an increase in thickness of the capacitance insulating film 12 at both end portions thereof, which has been observed in the conventional semiconductor memory device described above, and to hold the electrostatic capacitance of the capacitance insulating film 12 at an appropriate value. Consequently, the capacitive coupling ratio between the control gate electrode 13 and the floating gate electrode 11 is held within a proper range in a capacitance portion including the floating gate electrode 11, the capacitance insulating film 12, and the control gate electrode 13. Thus, required characteristics such as high write/erase speed and sufficient amount of read current can be retained even when an operating voltage and a gate length are further reduced.

Figure 3:
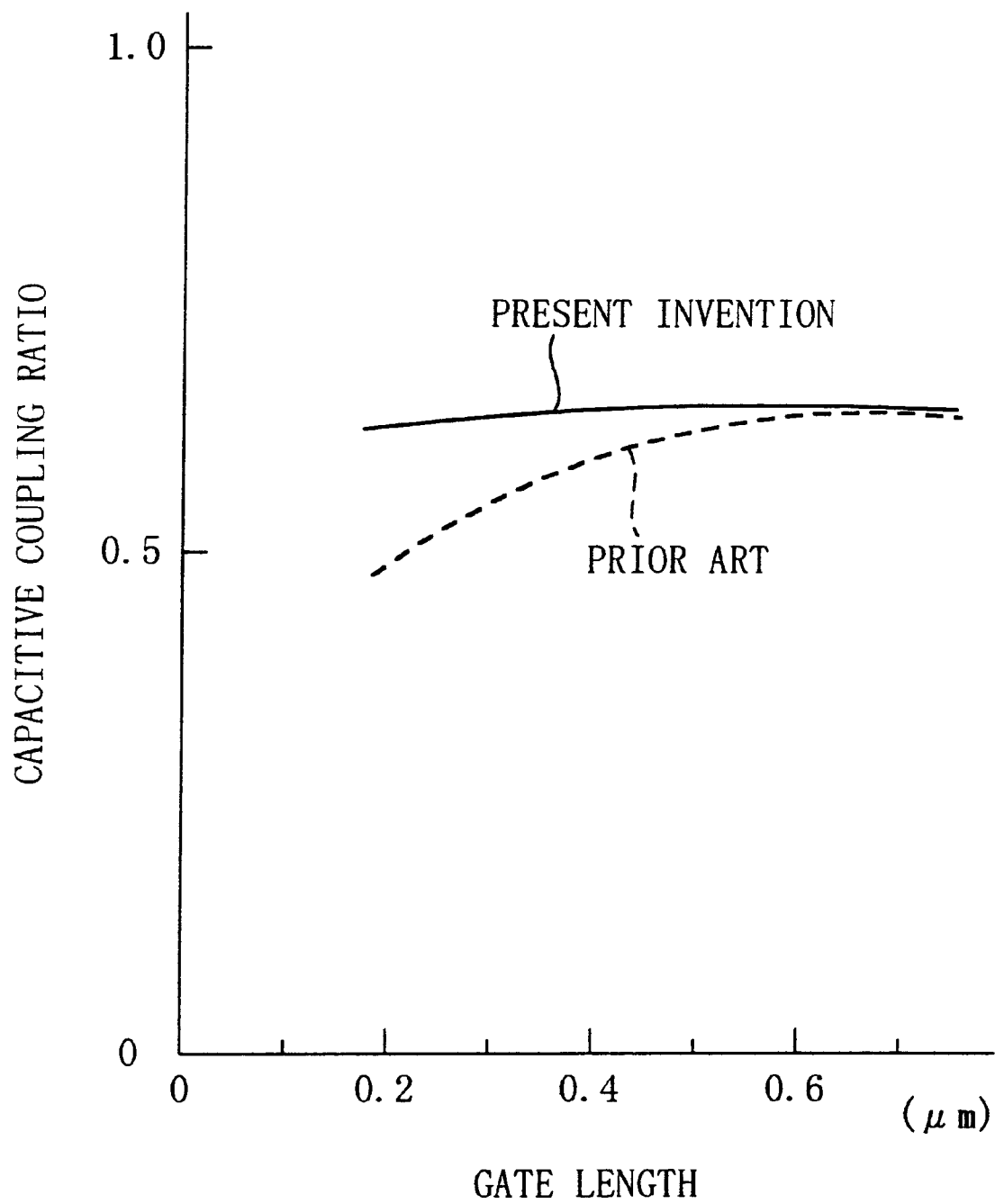
FIG. 3 is a graph showing the dependence of a capacitive coupling ratio on a gate length of the semiconductor memory device in the first embodiment and that of a conventional semiconductor memory device.

FIG. 3 is a graph showing, in comparison, the dependence of a capacitive coupling ratio on a gate length of the floating-gate semiconductor memory device of this embodiment and that of a conventional semiconductor memory device. In FIG. 3, the horizontal axis represents a gate length, which is the lateral dimension of the control gate electrode 13 in cross section shown in FIG. 1, and the vertical axis represents a capacitive coupling ratio between the floating gate electrode and the control gate electrode. As shown in the drawing, as the gate length or an electrode length is being reduced from 0.5 $\mu$m, the capacitive coupling ratio in the capacitance portion of the conventional semiconductor memory device is decreasing abruptly. By contrast, the capacitive coupling ratio in the capacitance portion of the semiconductor memory device of this embodiment hardly decreases even when the gate length is 0.4 $\mu$m or less. It will be understood that the present invention can hold the capacitive coupling ratio between the control gate electrode and the floating gate electrode within a proper range even when the gate length is reduced with the miniaturization of semiconductor memory devices.

Next, the process steps for manufacturing the semiconductor memory device of this embodiment will be described with reference to FIGS. 2A to 2D.

Figure 2A:
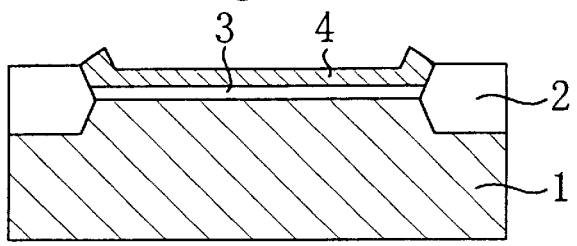
FIGS. 2A to 2D are cross-sectional views illustrating the process steps of manufacturing the semiconductor memory device in the first embodiment.

First, in the process step shown in FIG. 2A, a silicon oxide film 3 with a thickness of about 30 nm and a silicon nitride film 4 with a thickness of about 100 nm are formed sequentially on the silicon substrate 1. The two films are then patterned to form openings in respective regions to be isolations. The silicon substrate 1 exposed in the openings is oxidized from the surface thereof, thereby forming field oxide films 2 each having a thickness of about 700 nm.

Figure 2B:
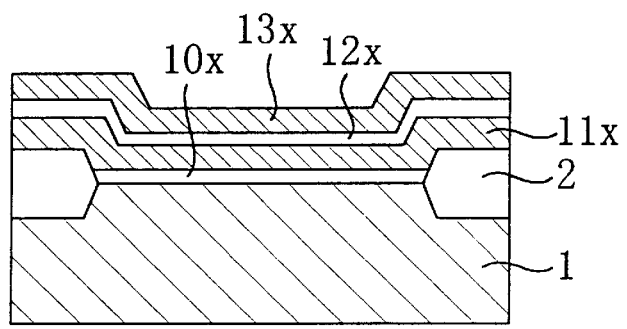

Next, in the process step shown in FIG. 2B, the silicon nitride film 4 and the silicon oxide film 3 are removed. Thereafter, a silicon oxide film 10$x$ with a thickness of about 30 nm is formed on the substrate by thermal oxidization. Subsequently, a polysilicon film 11$x$ with a thickness of about 300 nm, which has been doped with phosphorus at a concentration of about $2\times10^{20}$ cm$^3$, is formed on the silicon oxide film 10$x$ by chemical vapor deposition. The polysilicon film 11$x$ is then thermally oxidized to form a silicon oxide film 12$x$ to be a capacitance insulating film. In this embodiment, the polysilicon film 11$x$ is oxidized in an oxygen atmosphere at 1000° C. to form the silicon oxide film 12$x$ with a thickness of about 25 nm. A polysilicon film 13$x$ with a thickness of about 400 nm, which has been doped with phosphorous at a concentration of about $2\times10^{20}$ cm$^{-3}$, is further formed on the silicon oxide film 12$x$ by chemical vapor deposition.

Figure 2C:
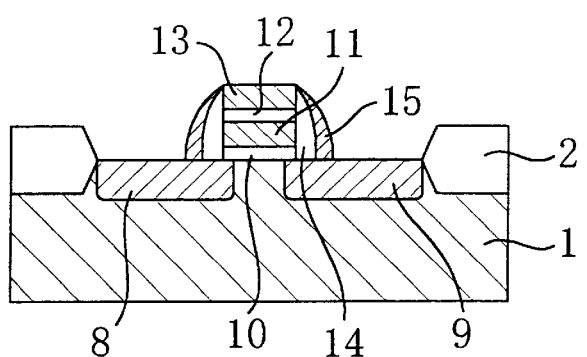

Next, in the process step shown in FIG. 2C, the polysilicon film 13$x$, the silicon oxide film 12$x$, the polysilicon film 11$x$, and the silicon oxide film 10$x$ are patterned to form an electrode unit including a gate insulating film 10, a floating gate electrode 11, a capacitance insulating film 12, and a control gate electrode 13. Thereafter, arsenic ions at a dose of $4\times10^{15}$ cm$^{-3}$ are implanted into the silicon substrate 1 with implantation energy of 50 keV by using the overall electrode unit and field oxide films 2 as a mask, thereby forming a source region 8 and a drain region 9 to be self-aligned with the electrode unit.

Then, a silicon oxide film with a thickness of about 250 nm is deposited on the substrate by chemical vapor deposition and subjected to anisotropic dry etching to form first spacer films 14 on both side faces of the electrode unit including the gate insulating film 10, the floating gate electrode 11, the capacitance insulating film 12, and the control gate electrode 13. Subsequently, a silicon nitride film with a thickness of about 150 nm is deposited on the substrate by chemical vapor deposition and subjected to anisotropic dry etching to form second spacer films 15 for preventing oxidization on the respective first spacer films 14. The silicon nitride film is formed by Low-pressure chemical vapor deposition at 750° C. by utilizing the chemical reaction between dichlorosilane (SiH$_2$Cl$_2$) and ammonia (NH$_3$), for example. During this reaction, the ratio of the flow rate of ammonia (NH$_3$) to the flow rate of dichlorosilane (SiH$_2$Cl$_2$) is set at 5.

Figure 2D:
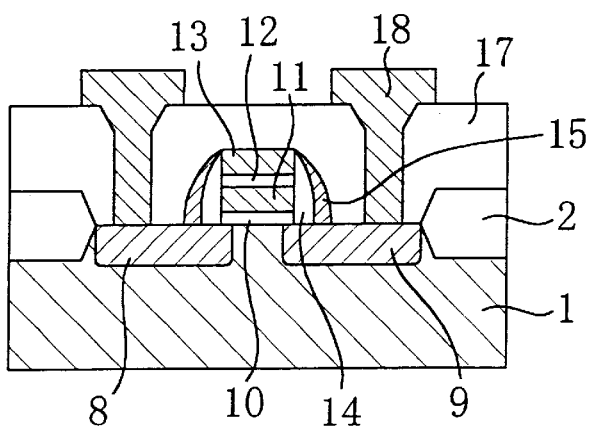

Next, in the process step shown in FIG. 2D, an interlayer insulating film 17 composed of silicon oxide with a thickness of about 1000 nm is formed over the entire surface of the substrate by chemical vapor deposition. Then, a heat treatment is conducted in an oxygen atmosphere at 1000° C. for 20 minutes in order to activate the impurity in the source/drain regions 8 and 9 and densify the texture of the silicon oxide film as the interlayer insulating film 17. During the heat treatment, it is possible to prevent oxygen from being supplied to the silicon oxide film constituting the capacitance insulating film 12 and to the polysilicon film constituting each of the gate electrodes 11 and 13. This is because the first spacer films 14 composed of silicon oxide and the second spacer films 15 composed of silicon nitride are formed in this order on both side faces of the electrode unit including the gate insulating film 10, the floating gate electrode 11, the capacitance insulating film 12, and the control gate electrode 13. Consequently, the phenomenon of the increased thickness at both ends of the capacitance insulating film 12 is no more observed.

Next, contact holes reaching the source/drain regions 8 and 9 and a contact hole (not shown) reaching the control gate electrode 13 are formed in the interlayer insulating film 17. Thereafter, an aluminum alloy film is deposited on the substrate and patterned to form the aluminum electrode 18.

The floating-gate semiconductor memory device shown in FIG. 1 is formed by performing the foregoing manufacturing process steps.

The floating-gate semiconductor memory device of the first embodiment may also be modified as follows.

Figure 4:
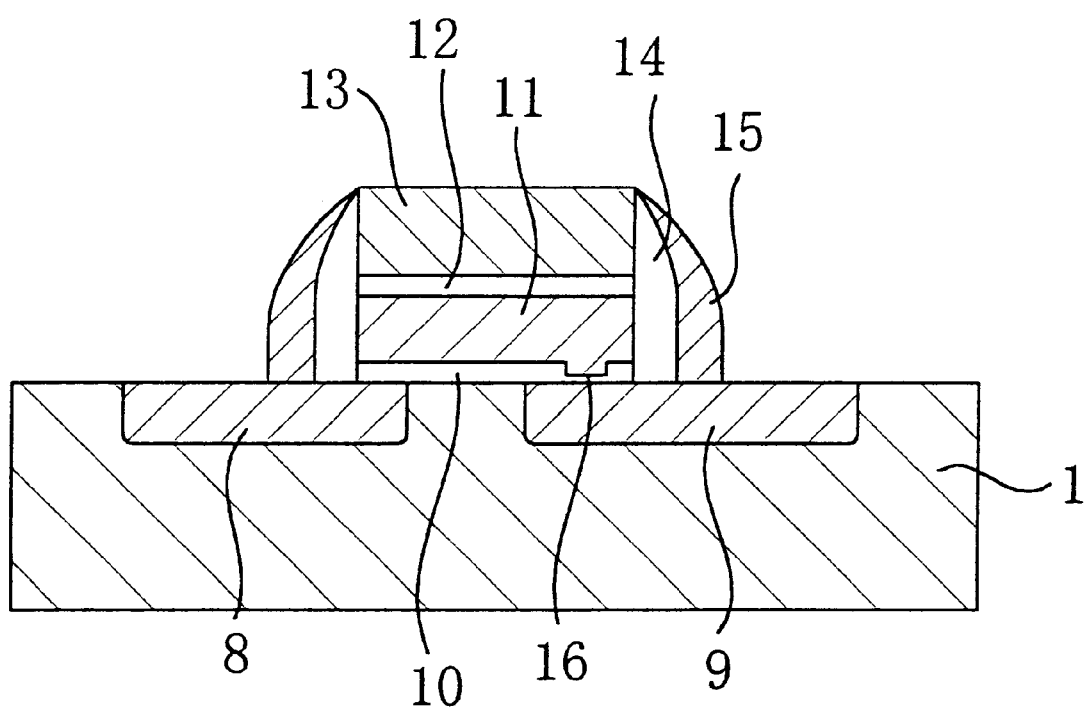
FIG. 4 is a cross-sectional view of a semiconductor memory device serving as a floating-gate semiconductor memory device with a tunnel insulating film in a variation of the first embodiment.

FIG. 4 is a cross-sectional view of a semiconductor memory device obtained by partially etching the gate insulating film 10 to form a tunnel insulating film 16 with a thickness of about 10 nm in the floating-gate semiconductor memory device in the first embodiment.

Although the floating-gate semiconductor memory device of the first embodiment has a stacked gate structure in which the floating gate electrode is formed over the entire surface of the channel region interposed between the source/drain regions 8 and 9, the structure including the spacer films according to the present invention is also applicable to a split gate structure in which the floating gate electrode is formed over only a part of the channel region interposed between the source/drain regions 8 and 9.

Embodiment 2

Next, a floating-gate semiconductor memory device with an erasable gate in a second embodiment will be described.

Figure 5:
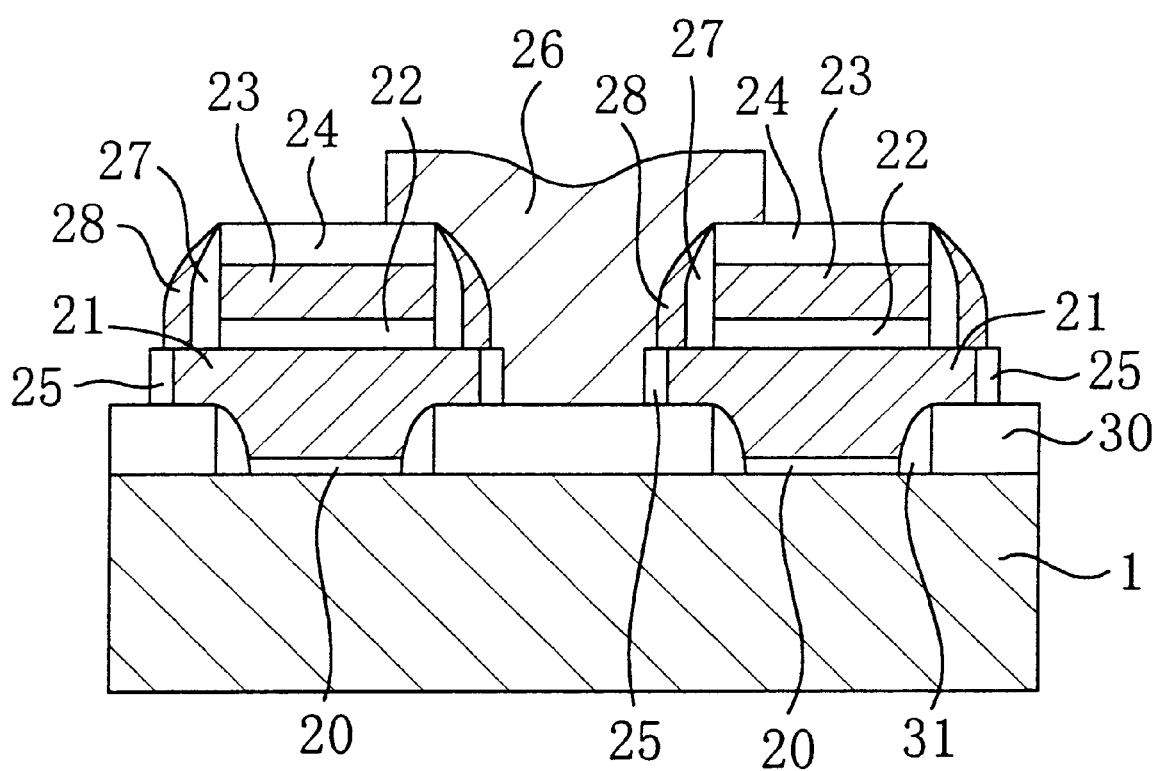
FIG. 5 is a cross-sectional view of a floating-gate semiconductor memory device with an erasing gate electrode in the second embodiment.

FIG. 5 is a cross-sectional view of the semiconductor memory device in the second embodiment. It is noted that the structure shown in FIG. 5 is on a cross section perpendicular to the gate longitudinal direction. FIG. 5 shows a pair of cells and an erasing gate electrode 26 used in common for the pair of cells. First, the structure of one of the pair of cells will be described.

As shown in FIG. 5, active regions isolated from each other by element-isolating insulating films composed of silicon oxide films 30 and 31 are provided on a P-type silicon substrate 1. A gate insulating film 20 composed of silicon oxide with a thickness of about 30 nm and a floating gate electrode 21 composed of polysilicon with a thickness of about 400 nm are formed sequentially on each of the active regions. A capacitance insulating film 22 composed of silicon oxide with a thickness of about 25 nm, a control gate electrode 23 composed of polysilicon with a thickness of about 400 nm, and an on-gate insulating film 24 composed of silicon oxide with a thickness of about 300 nm are formed on each of the floating gate electrodes 21. Tunnel insulating films 25, each composed of silicon oxide with a thickness of about 35 nm, are formed on the respective side faces of the floating gate electrode 25 by oxidizing regions in the vicinity of the side faces of each of the polysilicon films. In addition, first spacer films 27, each composed of silicon oxide with a maximum thickness of about 200 nm (lateral dimension at its lower end) which has been formed over the respective side faces of the floating gate electrode 21, the capacitance insulating film 22, and the control gate electrode 23, and second spacer films 28, each composed of silicon nitride with a maximum thickness of about 100 nm (lateral dimension at its lower end) which has been formed on each of the first spacer films 27, are further provided.

On the silicon oxide film 30 to be a region interposed between the pair of cells, an erasing gate electrode 26 is further formed so as to be used in common for the pair of cells. The erasing gate electrode 26 is composed of polysilicon 26 with a thickness of about 400 nm. The erasing gate electrode 26 is opposed to the capacitive insulating films 22, the control gate electrodes 23, and the on-gate insulating films 24 via the first and second spacer films 27 and 28, while it is opposed to the floating gate electrodes 21 via the tunnel insulating films 25.

It is noted that source/drain regions are also formed in the silicon substrate 1 by introducing a high-concentration N-type impurity into the silicon substrate 1, though not shown in FIG. 5.

In the semiconductor memory device of this embodiment, the second spacer films 28, made of anti-oxidizing silicon nitride, are provided on the first spacer films 27, made of silicon oxide and formed on the respective side faces of the capacitance insulating films 22 including the silicon oxide films. Thus, it is possible to prevent both end portions of the polysilicon films, constituting the control gate electrodes 23, from being oxidized during a high-temperature oxidizing step (normally performed at 900° C. to 1000° C.) for oxidizing the polysilicon films constituting the floating gate electrodes 21 and thereby forming the tunnel insulating films 25. As a result, an increase in thickness of the capacitance insulating film 22 at both end portions thereof can be suppressed.

Consequently, in the semiconductor memory device of this embodiment, the thickness at both end portions of the capacitance insulating film 22 is not increased unlike the conventional semiconductor memory device and therefore, the electrostatic capacitance of the capacitance insulating film can be held at a proper value. That is to say, the capacitive coupling ratio between the control gate electrode 23 and the floating gate electrode 21 can be held within a proper range in the capacitance portion including the floating gate electrode 21, the capacitance insulating film 22, and the control gate electrode 23. As a result, required characteristics such as high write/erase speed and a sufficient amount of read current can be ensured even when operating voltage and gate length are further reduced.

Next, the process steps for manufacturing the semiconductor memory device of this embodiment will be described with reference to FIGS. 6A to 6C and FIGS. 7A and 7B.

Figure 6A:
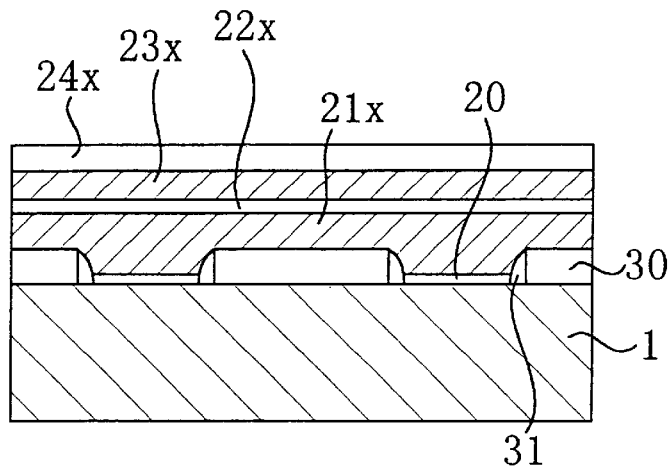
FIGS. 6A to 6C are cross-sectional views illustrating the process steps of manufacturing the semiconductor memory device in the second embodiment, which steps include respective process steps preceding the step of forming a floating gate electrode.

First, in the process step shown in FIG. 6A, a silicon oxide film 30 with a thickness of about 30 nm for isolating the active regions from each other is formed on a silicon substrate 1. Then, silicon oxide films 31 are formed on both side faces of the silicon oxide film 30. Thereafter, gate insulating films 20, each composed of silicon oxide with a thickness of about 30 nm, are formed on the individual active regions by thermal oxidation. Subsequently, a polysilicon film $21x$ with a thickness of about 300 nm, which has been doped with phosphorus at a concentration of about $2\times10^{20}$ cm$^{-3}$ is formed on the substrate by chemical vapor deposition. The polysilicon film $21x$ is then thermally oxidized to form a silicon oxide film $22x$ to be a capacitance insulating film. In this embodiment, the polysilicon film $21x$ is oxidized in an oxidizing atmosphere at 1000° C. to form the silicon oxide film $22x$ with a thickness of about 25 nm. A polysilicon film $23x$ with a thickness of about 400 nm, which has been doped with phosphorous at a concentration of about $2\times10^{20}$ cm$^{-3}$, and a silicon oxide film $24x$ with a thickness of about 300 nm are further formed on the silicon oxide film $22x$ in this order by chemical vapor deposition.

Figure 6B:
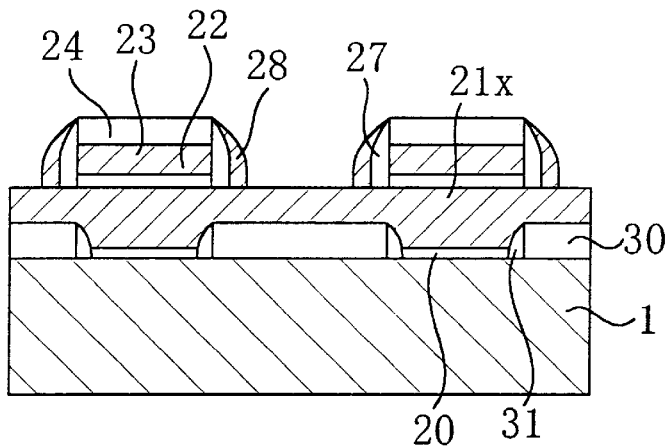

Next, in the process step shown in FIG. 6B, the silicon oxide film $24x$, the polysilicon film $23x$, and the silicon oxide film $22x$ are patterned to form a capacitance insulating films 22, a control gate electrodes 23, and an on-gate insulating films 24. Then, a silicon oxide film with a thickness of about 250 nm is deposited on the substrate by chemical vapor deposition and subjected to anisotropic dry etching to form first spacer films 27, each composed of silicon oxide over the respective side faces of the capacitance insulating films 22, the control gate electrodes 23, and the on-gate insulating films 24. Subsequently, a silicon oxide film with a thickness of about 150 nm is further deposited on the substrate by chemical vapor deposition and subjected to anisotropic dry etching to form second spacer films 28 for preventing oxidization on the respective first spacer films 27.

Figure 6C:
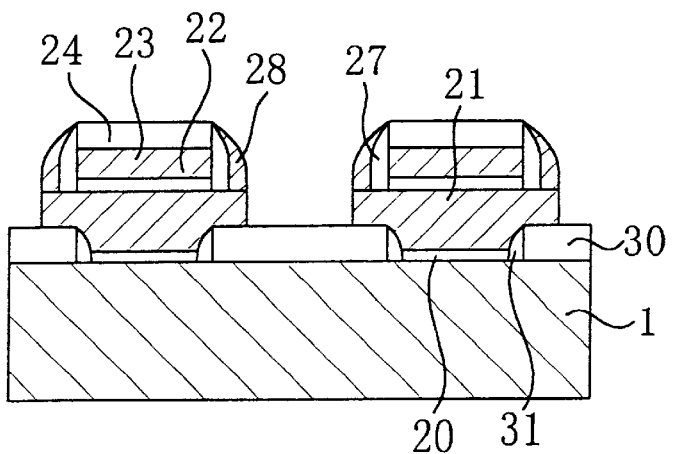

Next, in the process step shown in FIG. 6C, etching is performed by using an electrode unit including the spacer films 28 to pattern the polysilicon film 21x and thereby form floating gate electrodes 21. At this stage, the side faces of the floating gate electrodes 21 are exposed to be self-aligned with the side faces of the second spacer films 28.

Figure 7A:
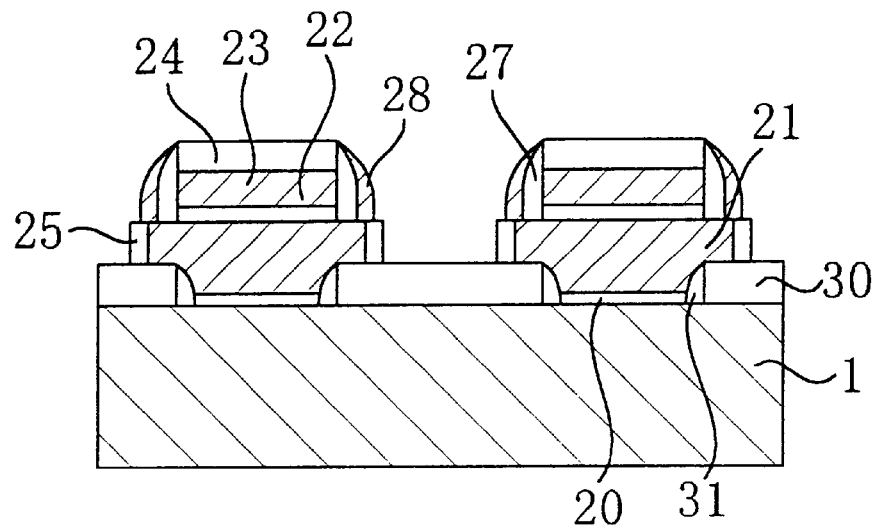
FIGS. 7A and 7B are cross-sectional views illustrating the process steps of manufacturing the semiconductor memory device in the second embodiment, which steps include the process step of thermally oxidizing the side faces of the floating gate electrode and subsequent process steps.

Then, in the process step shown in FIG. 7A, the exposed side faces of the floating gate electrodes 21 are thermally oxidized in a water vapor atmosphere at 900° C. to form tunneling insulating films 25, each composed of silicon oxide with a thickness of about 30 nm. Since the second spacer films 28 composed of silicon nitride have been formed, an increase in thickness of the capacitance insulating film 22 at both end portions thereof is suppressed in the same way as in the first embodiment.

Figure 7B:
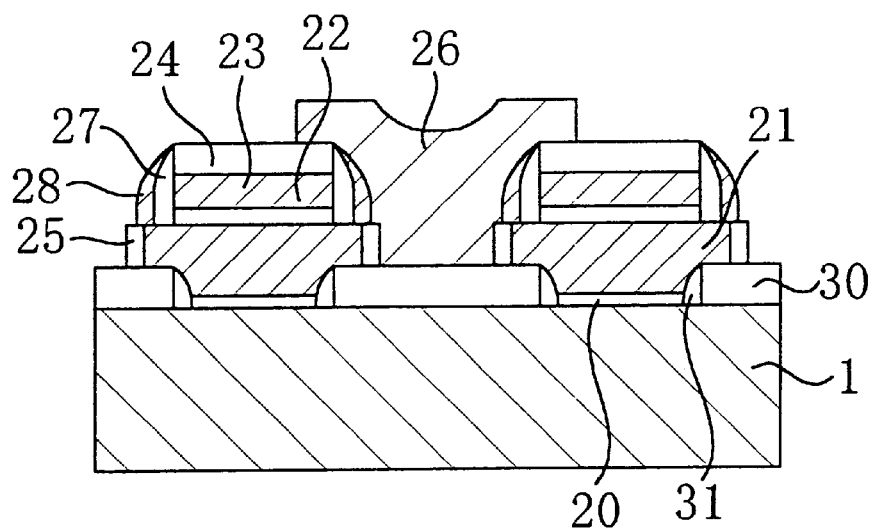

Subsequently, in the process step shown in FIG. 7B, a polysilicon film with a thickness of about 400 nm is formed over the entire surface of the substrate by chemical vapor deposition. The polysilicon film is then patterned by utilizing a photoetching technique, thereby forming an erasing gate electrode 26 covering the tunneling insulating films 25.

Thereafter, impurity ions are implanted into the active regions of the silicon substrate 1 to form the source and drain regions. However, the description of this process step will be omitted herein, since the source/drain regions are not shown in the cross sections of FIGS. 7A and 7B.

Although various steps of forming an interlayer insulating film, metal wiring, a protective film, and a bonding pad are performed subsequently, the description thereof will also be omitted, since they can be formed through known technology and are irrelevant to the essence of the present invention.

Other Embodiments

Next, other embodiments, different from the foregoing first and second embodiments, will be described with respect to exemplary structures of the capacitance portion including first and second conductor portions and an insulating film interposed therebetween.

Figure 8:
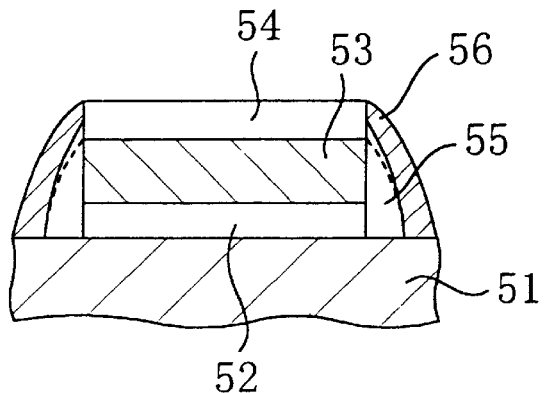
FIG. 8 is a cross-sectional view of a semiconductor memory device including an on-gate insulating film composed of silicon oxide and a first spacer film formed by over-etching in another embodiment.

FIG. 8 shows a structure of an electrode unit in which a capacitance insulating film 52 composed of silicon oxide or the like, a second conductive film 53 composed of polysilicon or the like, and an on-gate insulating film 54 composed of silicon oxide or the like are provided on a first conductive film 51 composed of polysilicon or the like. First spacer films 55 and second spacer films 56 are formed over the respective side faces of the capacitance insulating film 52, the second conductive film 53, and the on-gate insulating film 54. Although the electrode unit has the same structure as that of the second embodiment, the first conductive film 51 may be patterned to have the same planar shape as that of the capacitance insulating film 52 and the second conductive film 53 and the first and second spacer films 55 and 56 may extend to cover the side faces of the first conductive film 51 in the same way as in the first embodiment.

In contrast to the structure of the second embodiment, the first spacer films shown in FIG. 8 have an upper end lower in level than the top face of the on-gate insulating film 54. Such a structure is easily implemented by depositing and over-etching a silicon oxide film during anisotropic etching for forming the first spacer films 55. By lowering the upper ends of the first spacer films 55 in this manner, the contact area between the first spacer films 55 and the on-gate insulating film 54 can be reduced. Thus, it is advantageously possible to prevent, with more certainty, oxygen from passing through the silicon oxide film to reach both end portions of the capacitance insulating film 52 during a heat treatment in an oxidizing atmosphere, even if each of the on-gate insulating film 54 and the first spacer films 55 is composed of silicon oxide. However, oxygen passing through the contact portion between the on-gate insulating film 54 and the first spacer film 55 should travel along a long thin path to reach both end portions of the capacitance insulating film 52. Thus, in this second embodiment, the amount of oxygen reaching both end portions of the capacitance insulating film 52 (and the portions of the first and second conductive films 51 and 53 in contact with both end portions) is not so large. Consequently, even the electrode unit structure of the second embodiment can effectively suppress an increase in thickness of both end portions of the capacitance insulating film 52.

As indicated by the broken lines in FIG. 8, the supply of oxygen can be prevented with even more certainty by over-etching the silicon oxide film until the upper end of the first spacer film 55 is leveled with the top face of the second conductive film 53. Thus, it is possible to prevent an increase in thickness of both end portions of the capacitance insulating film 52 with even more certainty. As a result, particularly remarkable effects will be attained when the gate length is further reduced in the future.

Figure 9:
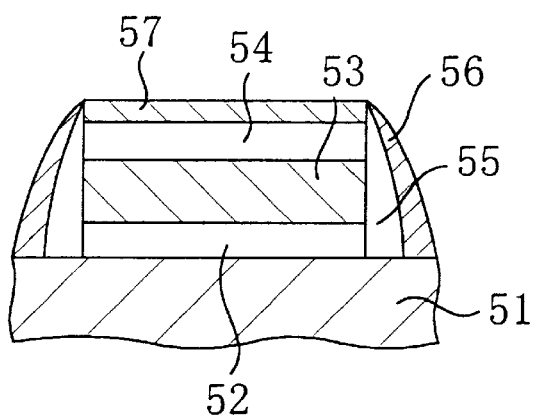
FIG. 9 is a cross-sectional view of a semiconductor memory device including an on-gate insulating film composed of a silicon oxide film and a silicon nitride film formed thereon and a first spacer film not over-etched in still another embodiment.

FIG. 9 is a cross-sectional view showing a structure of a capacitance portion in which an anti-oxidizing film 57, composed of an insulating material, such as silicon nitride, having a superior function of preventing oxygen from passing therethrough, is further formed on the on-gate insulating film 54. In this case, it is possible to prevent oxygen from being supplied to both end portions of the capacitance insulating film 52 with even more certainty, even if the silicon oxide film is not over-etched during anisotropic etching for forming the first spacer films 55. Therefore, it is advantageously possible to prevent an underlying layer from being damaged by over-etching with more certainty.

Figure 10:
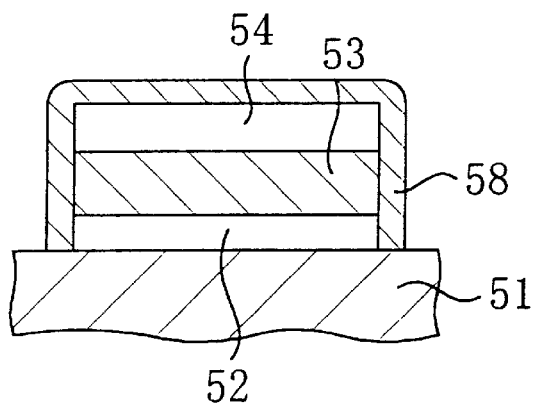
FIG. 10 is a cross-sectional view of a semiconductor memory device including an on-gate insulating film composed of silicon oxide and a silicon nitride film covering the whole electrode unit in still another embodiment.
Figure 11:
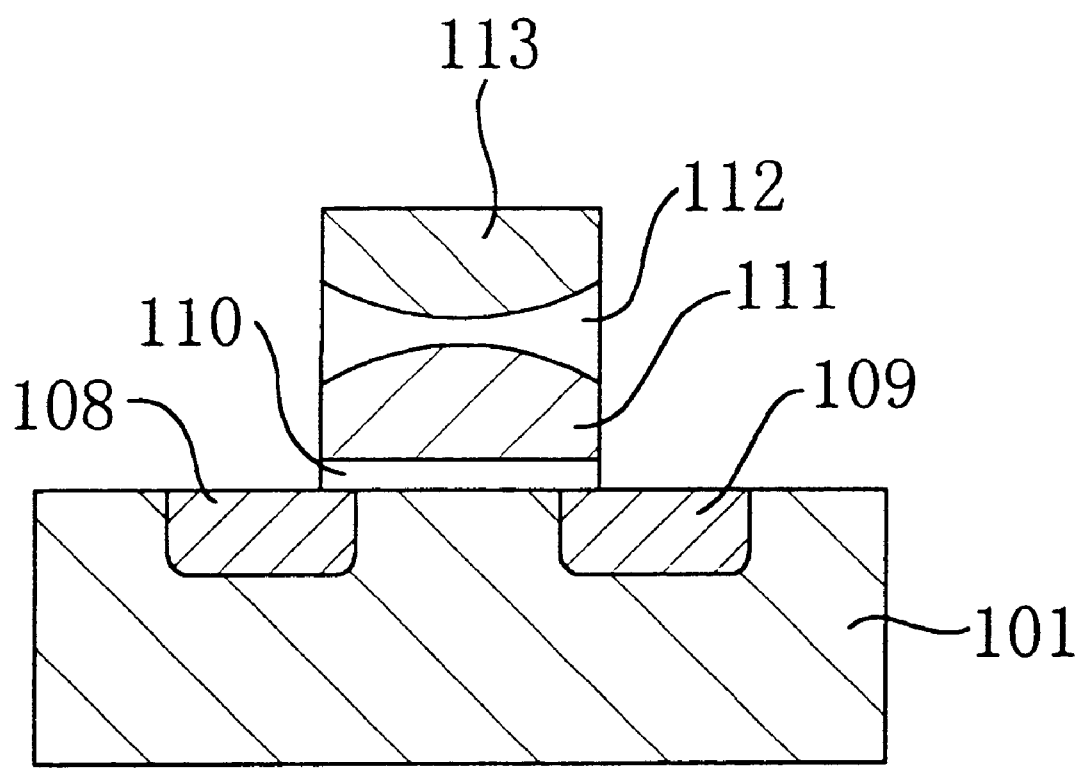
FIG. 11 is a cross-sectional view of a conventional floating-gate semiconductor memory device.

FIG. 10 is a cross-sectional view showing a structure of a capacitance portion in which an anti-oxidizing film 58, composed of silicon nitride or the like, is provided to cover the top face of the on-gate insulating film 54 and the respective side faces of the on-gate insulating film 54, the second conductive film 53, and the capacitance insulating film 52. In this case, it is also possible to prevent oxygen from being supplied to both end portions of the capacitance insulating film 52 with certainty. As a result, an increase in thickness of the capacitance insulating film 52 at both end portions thereof can be suppressed.

Although the capacitance insulating film is composed of silicon oxide in each of the foregoing embodiments, the capacitance insulating film according to the present invention is not limited thereto. Alternatively, the capacitance insulating film may be an insulating film containing silicon nitride such as a silicon-nitride/silicon-oxide two-layer film (ON film) and a silicon-oxide/silicon-nitride/siliconoxide three-layer film (ONO film). An oxynitride film may also be used.

Basically, the spacer film of the present invention may be any arbitrary film so long as it has a function of preventing oxygen from passing therethrough. However, in order not to establish an electrical connection between the individual conductive films or between the conductive film and the substrate, the spacer film is preferably a film made of an insulating material. Thus, the spacer film may not only be the multilayer film including the silicon oxide film (first spacer film) and the silicon nitride film (second spacer film) as described in each of the foregoing embodiments, but also be an insulating film containing silicon nitride such as a single-layer silicon nitride film shown in FIG. 10, a silicon-oxide/silicon-nitride/silicon-oxide three-layer film, and an oxynitride film. It is also possible to constitute the first spacer film by a silicon nitride film and the second spacer film by a silicon oxide film in each of the foregoing embodiments.

However, since a silicon nitride film is more likely to increase leakage current than a silicon oxide film, a silicon oxide film is preferably used for a component in direct contact with an electrode.

What is claimed is:

1. A semiconductor device, comprising;
   a semiconductor substrate;
   a gate insulating film provided on said semiconductor substrate;
   a first conductive film provided on said gate insulating film;
   a dielectric film, which is provided on said first conductive film and contains an oxidizing material;
   a second conductive film provided on said dielectric film;
   a first spacer film composed of an oxide film covering respective side fates of said gate insulating film, said first conductive film, said dielectric film, and said second conductive film; and
   a second spacer film covering the entire exposed portion of said first spacer film and having a function of preventing oxygen from passing therethrough.

2. The semiconductor device of claim 1, wherein said semiconductor device is a nonvolatile semiconductor memory device comprising:
   a floating gate electrode provided on said gate insulating film;
   a capacitance insulating film provided on said floating gate electrode; and
   a control gate electrode provided on said capacitance insulating film;
   said first conductive film being said floating gate electrode,
   said dielectric film being said capacitance insulating film,
   said second conductive film being said control gate electrode.

3. The semiconductor device of claim 1, further comprising
   a conductor protect film provided on said second conductive film, wherein said first spacer film extends to cover a side face of said conductor protect film.

4. The semiconductor device of claim 3, wherein said conductor protect film is composed of an oxide film,
   and wherein said first spacer film has an upper end lower in level than a top face of said conductor protect film.

5. The semiconductor device of claim 3, wherein said conductor protect film includes: a first conductor protect film composed of an oxide film; and a second conductor protect film provided on said first conductor protect film and having a function of preventing oxygen from passing therethrough,
   and wherein said first spacer film extends to cover respective side faces of said first and second conductor protect films.

6. The semiconductor device of claim 1, wherein said second spacer film contains silicon nitride.

7. The semiconductor device of claim 1, wherein said first and second spacer films are provided to cover a top face and both side faces of a structure constituted by said first conductive film, said dielectric film, and said second conductive film.

8. The semiconductor device of claim 1, wherein said second spacer film contains oxynitride.

9. A semiconductor device comprising:
   a semiconductor substrate;
   a gate insulating film provided on said semiconductor substrate;
   a floating gate electrode provided on said gate insulating film;
   a capacitance insulating film composed of a dielectric film provided on said floating gate electrode;
   a control gate electrode formed on said capacitance insulating film;
   a tunnel insulating film formed on a side face of said floating gate electrode or over a side face and a part of a top face of said floating gate electrode;
   an erasing gate electrode opposed to said floating gate electrode via said tunnel insulating film; and
   a spacer film provided over respective side faces of said control gate electrode and said capacitance insulating film and having a function of preventing oxygen from passing therethrough,
   wherein said spacer film is composed of a first spacer film provided over said control gate electrode and said capacitance insulating film and a second spacer film provided on said first spacer film and having a function of preventing oxygen from passing therethrough.

10. The semiconductor device of claim 9, further comprising a conductor protect film provided on said control gate electrode, wherein said first spacer film extends to cover a side face of said conductor protect film.

11. The semiconductor device of claim 9, wherein said conductor protect film is composed of an oxide film,
    and wherein said first spacer film has an upper end lower in level than a top face of said conductor protect film.

12. The semiconductor device of claim 9, wherein said conductor protect film includes: a first conductor protect film composed of an oxide film; and a second conductor protect film provided on said first conductor protect film and having a function of preventing oxygen from passing therethrough,
    and wherein said first spacer film extends to cover respective side faces of said first and second conductor protect films.

13. The semiconductor device of claim 9, wherein said second spacer film contains oxynitride.

14. The semiconductor device of claim 9, wherein said spacer film is provided to cover a top face and a slide face of a structure constituted by said control gate electrode and said capacitance insulating film.

15. The semiconductor device of claim 1, wherein said first spacer film extends to an upper surface of said semiconductor substrate.

16. The semiconductor device of claim 1, wherein said second spacer film extends to an upper surface of said semiconductor substrate.

* * * * *